US012136545B2

(12) United States Patent
Yahata et al.

(10) Patent No.: US 12,136,545 B2
(45) Date of Patent: Nov. 5, 2024

(54) METHOD OF MANUFACTURING SEMICONDUCTOR DEVICE, SUBSTRATE PROCESSING APPARATUS AND NON-TRANSITORY COMPUTER-READABLE RECORDING MEDIUM

(71) Applicant: Kokusai Electric Corporation, Tokyo (JP)

(72) Inventors: Takashi Yahata, Toyama (JP); Toshiyuki Kikuchi, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 729 days.

(21) Appl. No.: 17/205,822

(22) Filed: Mar. 18, 2021

(65) Prior Publication Data

US 2021/0296111 A1    Sep. 23, 2021

(30) Foreign Application Priority Data

Mar. 19, 2020   (JP) .................................. 2020-048622

(51) Int. Cl.
*H01L 21/02* (2006.01)
*C23C 16/34* (2006.01)
(Continued)

(52) U.S. Cl.
CPC ........ *H01L 21/0228* (2013.01); *C23C 16/345* (2013.01); *C23C 16/4412* (2013.01); *C23C 16/46* (2013.01); *H01L 21/0217* (2013.01)

(58) Field of Classification Search
CPC ............. H01L 21/0217; H01L 21/0228; C23C 16/345; C23C 16/4412; C23C 16/46; C23C 16/463; C23C 16/466
See application file for complete search history.

(56) References Cited

U.S. PATENT DOCUMENTS 6,174,783 B1 * 1/2001 Wakao .............. H01L 21/76224
                                                              438/653
2008/0305644 A1   12/2008 Noda et al.
(Continued)

FOREIGN PATENT DOCUMENTS

CN    104681464 A    6/2015
JP    H11-214501 A   8/1999
(Continued)

OTHER PUBLICATIONS

Office action in corresponding Taiwan Patent Application No. 110108870, dated Nov. 3, 2021, with English translation.
(Continued)

*Primary Examiner* — Brook Kebede
(74) *Attorney, Agent, or Firm* — Edell, Shapiro & Finnan, LLC (57) ABSTRACT

Described herein is a technique capable of forming a film so as to fill an inside of a recess provided on a surface of a substrate. According to one aspect of the technique, there is provided a method of manufacturing a semiconductor device, including: (a) forming a film by performing a cycle a predetermined number of times, the cycle including: (a-1) supplying a gas to a substrate in a process chamber; and (a-2) vacuum-exhausting an inner atmosphere of the process chamber; and (b) generating a predetermined temperature difference between a front surface of the substrate and a back surface of the substrate at a predetermined timing during (a).

17 Claims, 7 Drawing Sheets

(51) Int. Cl.
*C23C 16/44* (2006.01)
*C23C 16/46* (2006.01)

(56) References Cited

U.S. PATENT DOCUMENTS

| | | | |
|---|---|---|---|
| 2015/0152554 A1 | 6/2015 | Saido | |
| 2017/0283949 A1* | 10/2017 | Yahata | C23C 16/45561 |
| 2017/0372894 A1 | 12/2017 | Aburatani et al. | |
| 2018/0291051 A1* | 10/2018 | Anthis | C07F 15/02 |
| 2019/0081238 A1 | 3/2019 | Kitamura | |

FOREIGN PATENT DOCUMENTS

| | | |
|---|---|---|
| JP | 2007-073941 A | 3/2007 |
| JP | 2008-306003 A | 12/2008 |
| JP | 2009-158762 A | 7/2009 |
| JP | 2010-056145 A | 3/2010 |
| JP | 2015-082517 A | 4/2015 |
| JP | 2017-228639 A | 12/2017 |
| JP | 2019-050304 A | 3/2019 |
| KR | 10-2015-0062926 A | 6/2015 |

OTHER PUBLICATIONS

Notice of First Examination Report with English translation in Chinese Application No. 202110297632.9, dated Jul. 27, 2023, 18 pages.
Request for the Submission of an Opinion with English translation in Korean Application No. 10-2021-0033729, issued Nov. 30, 2022, 14 pages.
Office action in corresponding Japanese Patent Application No. 2020-048622, dated Oct. 7, 2021, with English translation.

* cited by examiner

METHOD OF MANUFACTURING SEMICONDUCTOR DEVICE, SUBSTRATE PROCESSING APPARATUS AND NON-TRANSITORY COMPUTER-READABLE RECORDING MEDIUM

CROSS REFERENCE TO RELATED APPLICATIONS

This application claims foreign priority under 35 U.S.C. § 119(a)-(d) to Application No. JP 2020-048622 filed on Mar. 19, 2020, the entire contents of which are hereby incorporated by reference.

TECHNICAL FIELD

The present disclosure relates to a method of manufacturing a semiconductor device, a substrate processing apparatus and a non-transitory computer-readable recording medium.

BACKGROUND

As a part of manufacturing processes of a semiconductor device, a process of forming a film on a substrate may be performed. In such a case, the process of forming the film may be performed so as to fill an inside of a recess (concave structure) provided on a surface of the substrate.

SUMMARY

Described herein is a technique capable of forming a film so as to fill an inside of a recess provided on a surface of a substrate.

According to one aspect of the technique of the present disclosure, there is provided a method of manufacturing a semiconductor device, including: (a) forming a film by performing a cycle a predetermined number of times, the cycle including: (a-1) supplying a gas to a substrate in a process chamber; and (a-2) vacuum-exhausting an inner atmosphere of the process chamber; and (b) generating a predetermined temperature difference between a front surface of the substrate and a back surface of the substrate at a predetermined timing during (a).

DETAILED DESCRIPTION

Hereinafter, one or more embodiments (also simply referred to as "embodiments") according to the technique of the present disclosure will be described with reference to the drawings.

First Embodiment

Hereinafter, a first embodiment according to the technique of the present disclosure will be described.

(1) Configuration of Substrate Processing Apparatus

Figure 1:
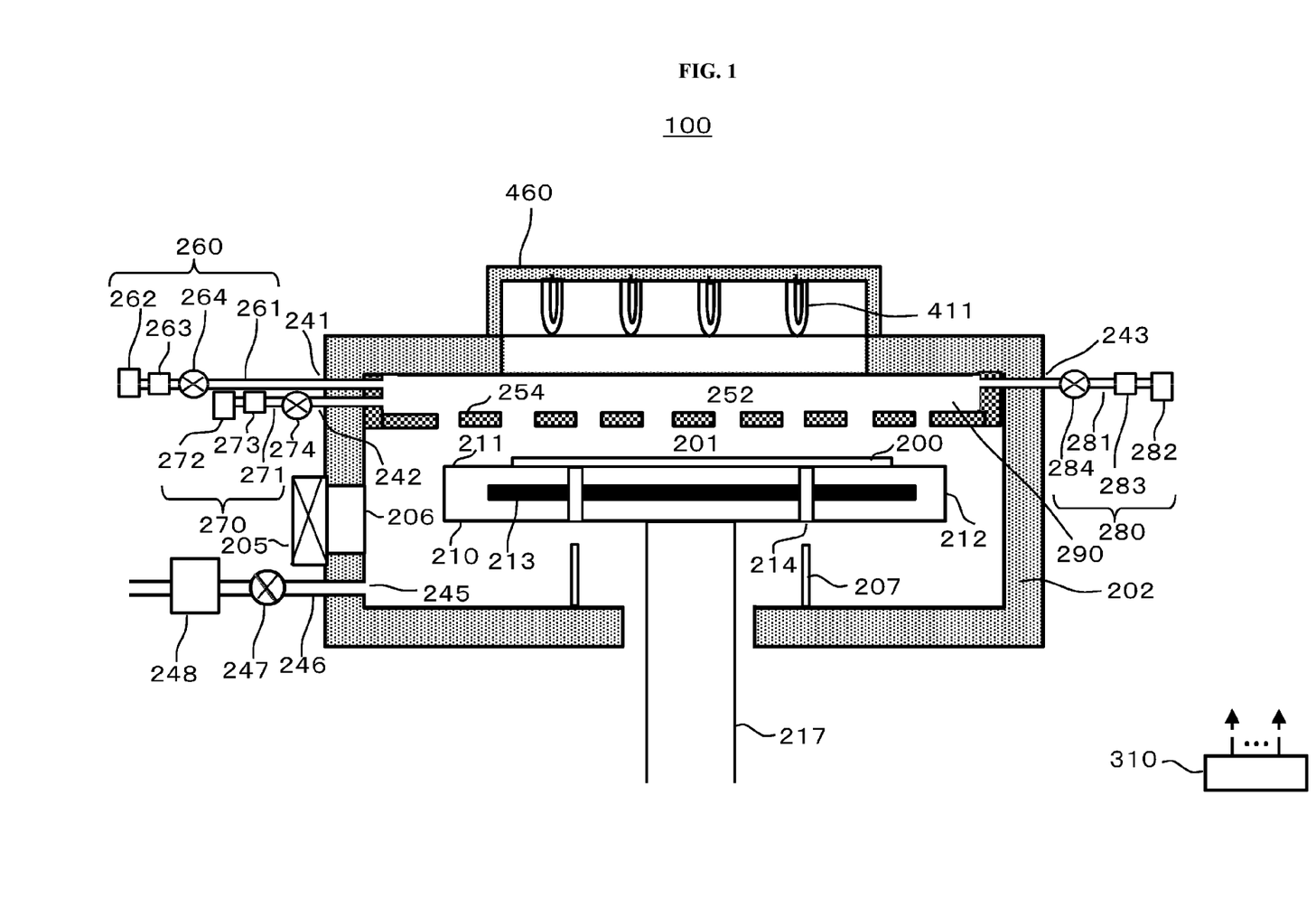
FIG. 1 schematically illustrates a vertical cross-section of an exemplary configuration of a substrate processing apparatus preferably used in a first embodiment described herein.

A substrate processing apparatus 100 according to the present embodiment will be described. The substrate processing apparatus 100 is an apparatus capable of forming a thin film on a wafer 200 serving as a substrate. As shown in FIG. 1, the substrate processing apparatus 100 is configured as a single wafer type substrate processing apparatus.

Process Vessel

As shown in FIG. 1, the substrate processing apparatus 100 includes a process vessel 202. For example, the process vessel 202 is a flat and sealed vessel whose horizontal cross-section is circular. A side wall or a bottom wall of the process vessel 202 is made of a metal material such as aluminum (Al) and stainless steel (SUS). A process chamber 201 in which the wafer 200 is processed is provided in the process vessel 202.

A substrate loading/unloading port 206 is provided on a side surface of the process vessel 202. The substrate loading/unloading port 206 is provided adjacent to a gate valve 205. The wafer 200 is transferred (moved) between a transfer chamber (not shown) and the process vessel 202 through the substrate loading/unloading port 206. Lift pins 207 are provided at the bottom of the process vessel 202.

A substrate support 210 configured to support the wafer 200 is provided in the process chamber 201. The substrate support 210 is constituted mainly by a substrate mounting table 212 provided with a substrate placing surface 211 on which the wafer 200 is placed. Through-holes 214 penetrated by the lift pins 207 are provided at the substrate mounting table 212 corresponding to the locations of the lift pins 207.

The substrate mounting table 212 is supported by a shaft 217. The shaft 217 penetrates the bottom of the process vessel 202. The shaft 217 is connected to an elevator (not shown) outside the process vessel 202. By operating the elevator to elevate or lower the shaft 217 and the substrate mounting table 212, the wafer 200 placed on the substrate placing surface 211 of the substrate mounting table 212 may be elevated or lowered.

When the wafer 200 is transferred, the substrate mounting table 212 is moved downward until the substrate placing surface 211 faces the substrate loading/unloading port 206 at the same height (that is, the substrate mounting table 212 is moved to a wafer transfer position). When the wafer 200 is processed, the substrate mounting table 212 is moved upward until the wafer 200 reaches a processing position (also referred to as a "wafer processing position") in the process chamber 201.

Specifically, when the substrate mounting table 212 is lowered to the wafer transfer position, upper ends of the lift pins 207 protrude from an upper surface of the substrate placing surface 211, and the lift pins 207 support the wafer 200 from thereunder. When the substrate mounting table 212 is elevated to the wafer processing position, the lift pins 207 are buried from the upper surface of the substrate placing surface 211, and the substrate placing surface 211 supports the wafer 200 from thereunder.

First Heater and Second Heater

A heater 213 serving as a second heater is embedded in the substrate mounting table 212. A controller 310 described later is configured to control an operation of the heater 213.

A lamp housing 460 is provided at a ceiling of the process vessel 202 at a position facing a surface (front surface) of the wafer 200. A plurality of lamps 411 serving as a first heater are provided in the lamp housing 460. The controller 310 described later is configured to control operations of the plurality of the lamps 411.

By using the heater 213 and the plurality of the lamps 411, it is possible to independently control a temperature on the front surface of the wafer 200 and a temperature on a back surface of the wafer 200 can be controlled to some extent. For example, when the heater 213 is turned on and the plurality of the lamps 411 are turned off, or when an output of the heater 213 is greater than an output of the plurality of the lamps 411, the temperature on the back surface of the wafer 200 can be set higher than the temperature on the front surface of the wafer 200 at least for a predetermined time. On the other hand, when the plurality of the lamps 411 are turned on and the heater 213 is turned off, or the output of the plurality of the lamps 411 is greater than the output of the heater 213, the temperature on the front surface of the wafer 200 can be set higher than the temperature on the back surface of the wafer 200 at least for a predetermined time.

Gas Introduction Holes

Gas introduction holes 241, 242 and 243 are provided above the process chamber 201 on a side wall of a shower head 290 described later. A configuration of a gas supplier (which is a gas supply system) connected to the gas introduction holes 241, 242 and 243 will be described later.

Shower Head

The shower head 290 serving as a gas dispersion structure communicating with the process chamber 201 is provided between the gas introduction holes 241, 242 and 243 and the process chamber 201. A gas such as a source gas, a reactive gas and an inert gas described later is introduced through the gas introduction holes 241, 242 and 243, and is supplied to a buffer chamber 252 of the shower head 290. The buffer chamber 252 is provided so as to be surrounded by the process vessel 202 and a dispersion plate 254.

The shower head 290 includes the dispersion plate 254 capable of dispersing (or diffusing) the gas between the buffer chamber 252 and the process chamber 201. The dispersion plate 254 is provided with a plurality of through holes. The dispersion plate 254 is arranged so as to face the substrate placing surface 211. For example, the dispersion plate 254 is made of a material such as quartz that does not block the heat radiated (emitted) from the plurality of the lamps 411. By supplying the gas through the dispersion plate 254, it is possible to uniformly supply the gas onto the wafer 200.

Source Gas Supplier

A source gas supplier (which is a source gas supply system) 260 is connected to the gas introduction hole 241. The source gas supplier 260 includes a gas supply pipe 261, and the gas supply pipe 261 is connected to the side surface of the process vessel 202 so as to communicate with the gas introduction hole 241. A gas source 262 of the source gas, a mass flow controller (MFC) 263 configured to adjust a flow rate of the source gas and a valve 264 are sequentially installed at the gas supply pipe 261 in order from an upstream side to a downstream side of the gas supply pipe 261. For example, as the source gas, hexachlorodisilane ($Si_2Cl_6$, abbreviated as HCDS) gas may be used.

Reactive Gas Supplier

A reactive gas supplier (which is a reactive gas supply system) 270 is connected to the gas introduction hole 242. The reactive gas supplier 270 includes a gas supply pipe 271, and the gas supply pipe 271 is connected to the side surface of the process vessel 202 so as to communicate with the gas introduction hole 242. A gas source 272 of the reactive gas, a mass flow controller (MFC) 273 configured to adjust a flow rate of the reactive gas and a valve 274 are sequentially installed at the gas supply pipe 271 in order from an upstream side to a downstream side of the gas supply pipe 271. For example, as the reactive gas, ammonia gas ($NH_3$ gas) may be used.

Inert Gas Supplier

An inert gas supplier (which is an inert gas supply system) 280 is connected to the gas introduction hole 243. The inert gas supplier 280 includes a gas supply pipe 281, and the gas supply pipe 281 is connected to the gas introduction hole 243. A gas source 282 of the inert gas, a mass flow controller (MFC) 283 configured to adjust a flow rate of the inert gas and a valve 284 are sequentially installed at the gas supply pipe 281 in order from an upstream side to a downstream side of the gas supply pipe 281. For example, as the inert gas, nitrogen gas ($N_2$ gas) may be used.

The MFCs 263, 273 and 283 and the valves 264, 274 and 284 of each gas supplier described above are electrically connected to the controller 310 described later, and are controlled by instructions from the controller 310.

According the present embodiment, the source gas supplier 260, the reactive gas supplier 270, the inert gas supplier 280 or combinations thereof may be referred to as the gas supplier.

Exhauster

An exhaust port 245 is provided on a side surface of an inner wall of the process vessel 202. An inner atmosphere of the process vessel 202 is exhausted through the exhaust port 245. An exhaust pipe 246 is connected to a side surface of an outer wall of the process vessel 202 so as to communicate with the exhaust port 245. An APC (Automatic Pressure Controller) valve 247 and a vacuum pump 248 are sequentially connected at the exhaust pipe 246 in order from an upstream side to a downstream side of the exhaust pipe 246. An exhauster (which is an exhaust system) is constituted mainly by the exhaust port 245, the exhaust pipe 246 and the APC valve 247. The exhauster may further include the vacuum pump 248.

Controller

The substrate processing apparatus 100 includes the controller 310 configured to control operations of components of the substrate processing apparatus 100.

Figure 2:
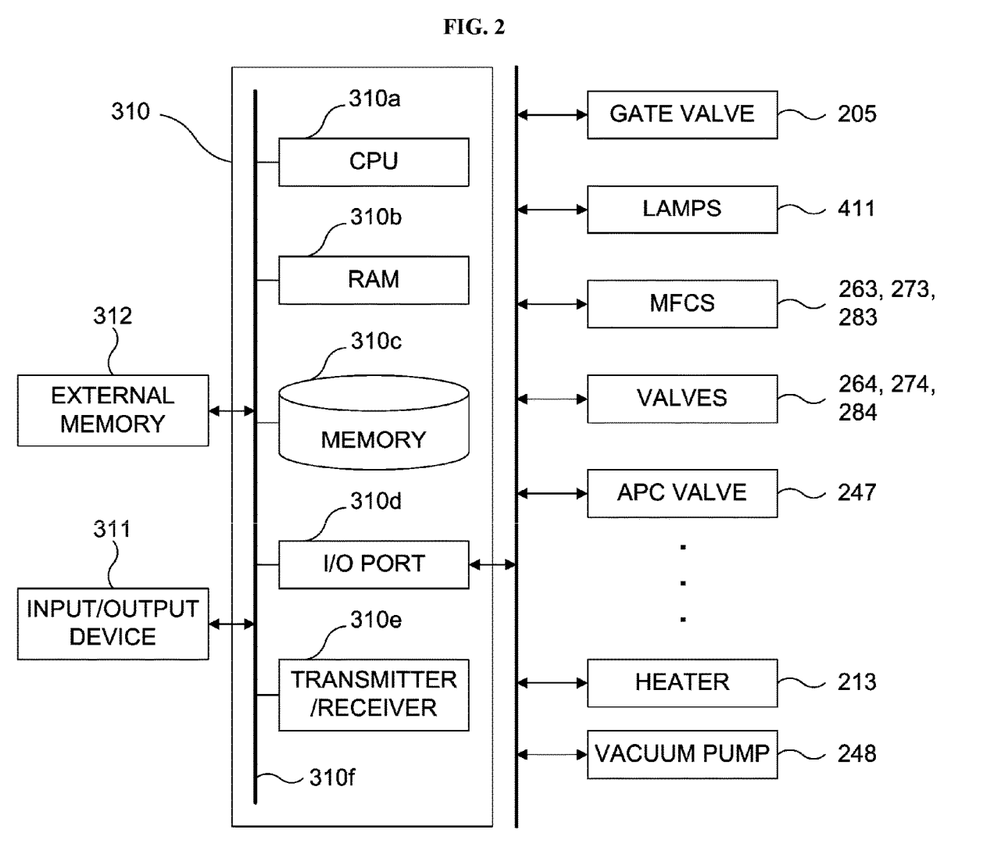
FIG. 2 is a block diagram schematically illustrating a configuration of a controller and related components of the substrate processing apparatus preferably used in the first embodiment described herein.

FIG. 2 is a block diagram schematically illustrating the controller 310 and related components of the substrate processing apparatus 100. The controller 310 serving as a control apparatus (control structure) is embodied by a computer including a CPU (Central Processing Unit) 310a, a RAM (Random Access Memory) 310b, a memory 310c, an I/O port 310d and a transmitter/receiver 310e. The RAM 310b, the memory 310c and the I/O port 310d may exchange data with the CPU 310a through an internal bus 310f.

For example, an input/output device 311 such as a touch panel (not shown) or an external memory 312 may be connected to the controller 310.

The memory 310c may be embodied by components such as a flash memory and a HDD (Hard Disk Drive). Data such as a control program configured to control the operation of the substrate processing apparatus 100 and a process recipe in which information such as the order and the conditions of a substrate processing described later is stored may be readably stored in the memory 310c. The process recipe is obtained by combining steps of the substrate processing described later such that the controller 310 can execute the steps to acquire a predetermine result, and functions as a program. Hereinafter, the process recipe and the control program may be collectively or individually referred to as a "program". In the present specification, the term "program" may indicate the process recipe alone, may indicate the control program alone, or may indicate both of the process recipe and the control program. The RAM 310b functions as a memory area (work area) where a program or data read by the CPU 310a is temporarily stored.

The I/O port 310d is electrically connected to the components of the substrate processing apparatus 100 such as the gate valve 205, the heater 213, the plurality of the lamps 411, the APC valve 247, the vacuum pump 248, the MFCs 263, 273 and 283, and the valves 264, 274 and 284.

The CPU 310a is configured to read the control program from the memory 310c and execute the read control program. Furthermore, for example, the CPU 310a is configured to read the process recipe from the memory 310c in accordance with an operation command inputted from the input/output device 311. According to the contents of the read recipe, the CPU 310a may be configured to control various operations such as an opening and closing operation of the gate valve 205, a turn-on operation and a turn-off operation of the heater 213, a temperature regulating operation (pressure adjusting operation) of the heater 213, a turn-on operation and a turn-off operation of the plurality of the lamps 411, a temperature adjusting operation of the plurality of the lamps 411, a pressure regulating operation (pressure adjusting operation) of the APC valve 247 and an operation of the vacuum pump 248.

The controller 310 may be embodied by a dedicated computer or by a general-purpose computer. For example, the controller 310 may be embodied by preparing the external memory 312 storing the program described above and by installing the program onto the general-purpose computer using the external memory 312. For example, the external memory 312 may include a magnetic tape, a magnetic disk such as a flexible disk and a hard disk, an optical disk such as a CD and a DVD, a magneto-optical disk such as an MO and a semiconductor memory such as a USB memory and a memory card. The means for providing the program to the computer (general-purpose computer) is not limited to the external memory 312. For example, the program may be supplied to the computer using communication means such as the Internet and a dedicated line without using the external memory 312. In addition, the memory 310c or the external memory 312 may be embodied by a non-transitory computer readable recording medium. Hereafter, the memory 310c and the external memory 312 may be collectively or individually referred to as the recording medium. In the present specification, the term "recording medium" may refer to the memory 310c alone, may refer to the external memory 312 alone or may refer to both of the memory 310c and the external memory 312.

(2) Substrate Processing

Subsequently, as a part of manufacturing processes of a semiconductor device, the substrate processing of performing a predetermined process on the wafer 200 by using the substrate processing apparatus 100 described above will be described with reference to FIGS. 3A and 3B. According to the present embodiment, for example, as the substrate processing step, a process of forming a film on the wafer 200 will be described. In the following description, the operations of the components constituting the substrate processing apparatus 100 are controlled by the controller 310. In addition, a recess such as a trench and a hole is formed on the surface (front surface) of the wafer 200 (see FIGS. 4A and 4B).

Substrate Loading and Placing Step S102

Figure 3A:
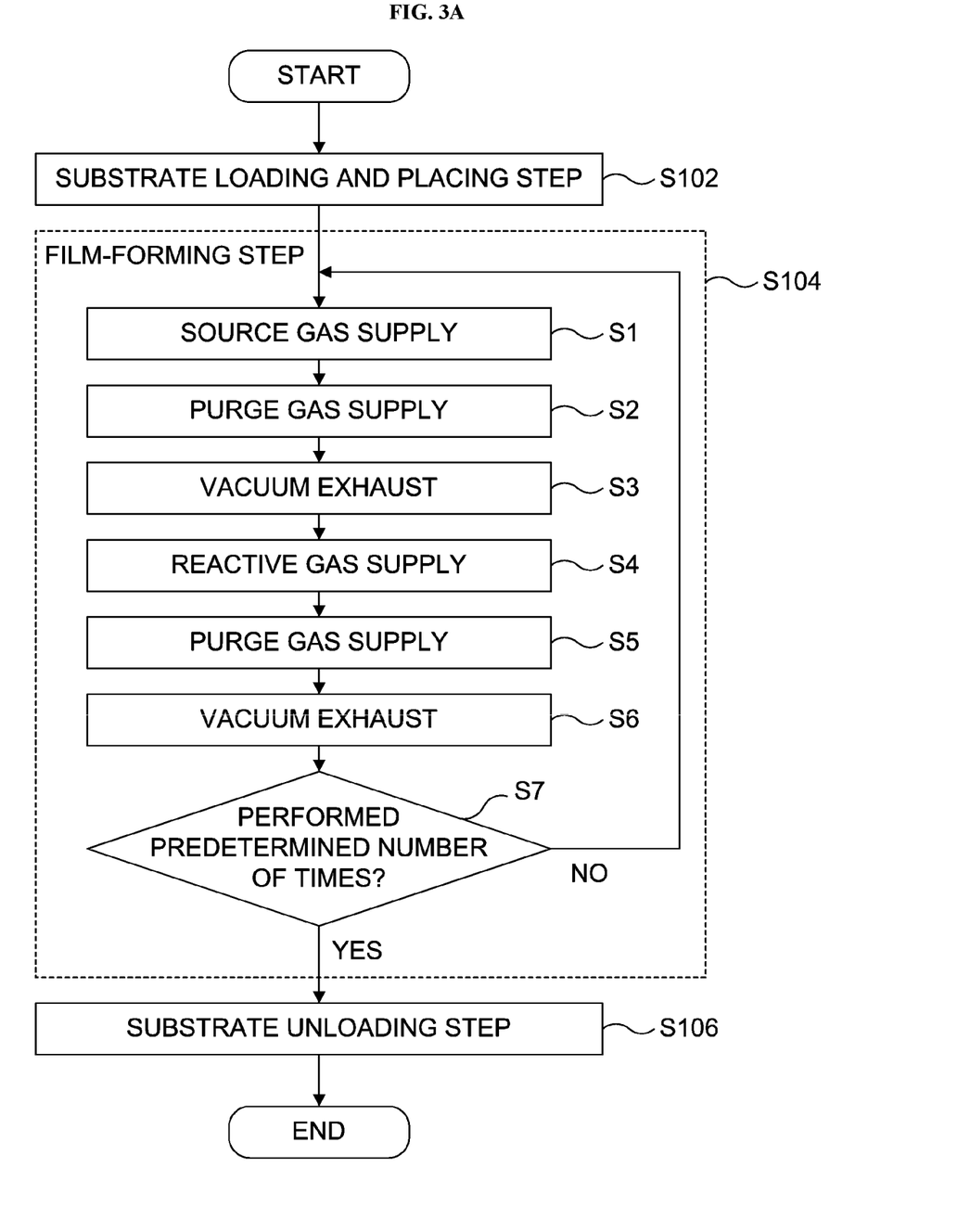
FIG. 3A is a flow chart schematically illustrating a substrate processing preferably used in the first embodiment described herein.
Figure 4A:
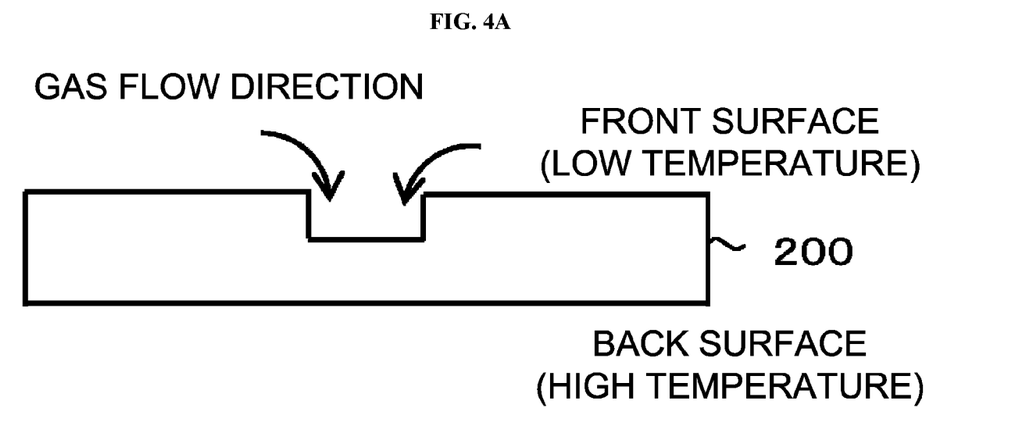
FIG. 4A schematically illustrates a gas flow when a temperature on a back surface of the substrate is higher than a temperature on a front surface of the substrate.

In a substrate loading and placing step S102, the substrate mounting table 212 is lowered to the wafer transfer position such that the lift pins 207 penetrate through the through-holes 214 of the substrate mounting table 212. As a result, the lift pins 207 protrude from the surface of the substrate mounting table 212 by a predetermined height. Subsequently, the gate valve 205 is opened, and the wafer 200 is transferred (loaded) into the process chamber 201 using a wafer transfer device (not shown). Then, the wafer 200 is placed onto the lift pins 207. As a result, the wafer 200 is supported on the lift pins 207 protruding from the surface of the substrate mounting table 212 in a horizontal orientation.

After the wafer 200 is transferred into the process chamber 201, the wafer transfer device is retracted to the outside of the process vessel 202, and the gate valve 205 is closed to seal (close) the inside of the process vessel 202 hermetically. Thereafter, by elevating the substrate mounting table 212, the wafer 200 is placed on the substrate placing surface 211 of the substrate mounting table 212.

When the wafer 200 is loaded into the process vessel, it is preferable that the $N_2$ gas serving as the inert gas is supplied by the inert gas supplier 280 into the process chamber 201 while exhausting the inner atmosphere of the process vessel 202 by the exhauster. Thereby, it is possible to suppress particles from entering the process vessel 202 and from adhering onto the wafer 200. The vacuum pump 248 may be continuously operated from the substrate loading and placing step S102 until at least a substrate unloading step S106 described later is completed.

The wafer 200 is heated to a desired temperature by at least one of the plurality of the lamps 411 and the heater 213 until a film-forming step S104 described later is started. Further, by adjusting an opening degree of the APC valve 247, an inner pressure of the process vessel 202 is controlled to a predetermined pressure.

Film-Forming Step S104

Thereafter, the film-forming step S104 is performed. In a film-forming sequence shown in FIG. 3B, a first step and a second step described later are performed.

First Step

Figure 3B:
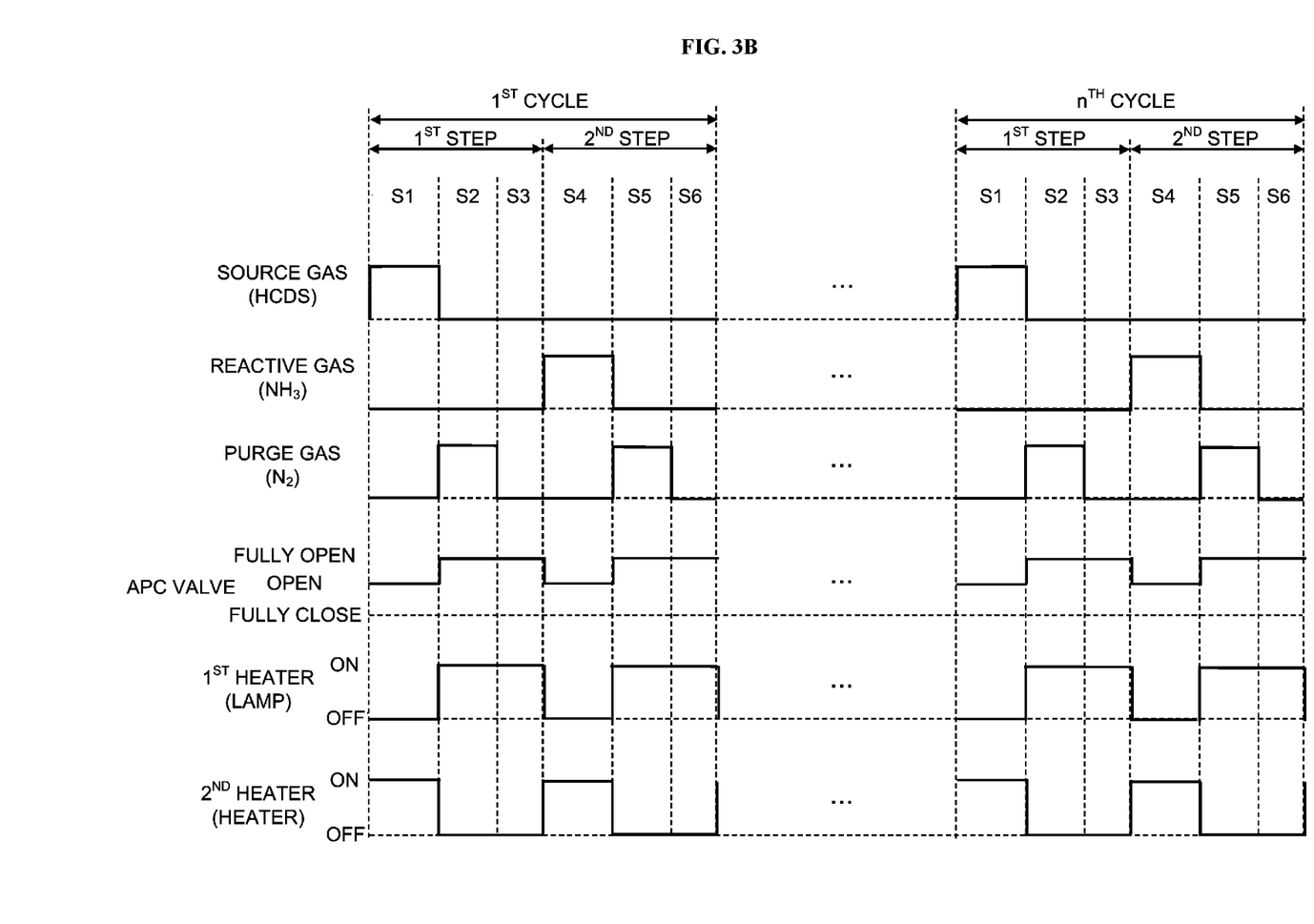
FIG. 3B schematically illustrates an exemplary film-forming sequence preferably used in the first embodiment described herein.

In the first step, a source gas supply (step S1), a purge gas supply (step S2) and a vacuum exhaust (step S3) are sequentially performed. Hereinafter, the steps S1 through S3 are described in order. In each of the source gas supply S1, the purge gas supply S2 and the vacuum exhaust S3, the exhauster performs an exhaust process. In the present specification, the term "vacuum exhaust" refers to the exhaust process performed while the source gas supply S1 (or a reactive gas supply S4 described later) and the purge gas supply S2 to the wafer 200 are stopped. That is, the term "vacuum exhaust" means that a pressure of a space above the wafer 200 in the process chamber 201 is depressurized as compared with the pressure of the space when the source gas (or the reactive gas) is supplied or when a purge gas (inert gas) is supplied.

First, the HCDS gas is supplied to the wafer 200 in the process chamber 201 (the source gas supply S1).

Specifically, the valve 264 is opened to supply the HCDS gas to the wafer 200 in the process chamber 201. When supplying the HCDS gas, the MFC 263 is adjusted so that a flow rate of the HCDS gas is adjusted to a predetermined flow rate.

When the HCDS gas is supplied to the wafer 200, the HCDS gas is decomposed and silicon (Si) contained in the HCDS gas is adsorbed on the surface of the wafer 200. Thereby, a silicon (Si)-containing layer is formed on the surface of the wafer 200.

However, the HCDS gas is less likely to reach a bottom of the recess formed on the surface of the wafer 200 than a peripheral side portion of the recess of the wafer 200. As a result, it is difficult to form the silicon-containing layer inside the recess of the wafer 200, particularly around the bottom of the recess of the wafer 200.

In order to address such a problem, according to the present embodiment, a temperature difference is generated between the front surface and the back surface of the wafer 200 at a timing of supplying the HCDS gas to the wafer 200 in the process chamber 201 (that is, the source gas supply S1). Specifically, the temperature on the back surface of the wafer 200 is set higher than the temperature on the front surface of the wafer 200. In a space where the temperature difference is present, the gas tends to flow from a low temperature location to a high temperature location. Therefore, by generating the temperature difference as described above between the front surface and the back surface of the wafer 200, it is possible to promote the supply of the HCDS gas from the peripheral side portion of the recess of the wafer 200 to the bottom of the recess (see FIG. 4A). As a result, it is possible to promote the formation of the silicon-containing layer around the bottom of the recess of the wafer 200. For example, by turning on the heater 213 provided with respect to the back surface of the wafer 200 and turning off the plurality of the lamps 411 provided with respect to the front surface of the wafer 200, and by decreasing the output of the plurality of the lamps 411 than the output of the heater 213, the temperature on the back surface of the wafer 200 can be set higher than the temperature on the front surface of the wafer 200 at least for a predetermined time.

After the silicon-containing layer is formed, the valve 264 is closed to stop the supply of the HCDS gas.

Subsequently, the inert gas such as the $N_2$ gas serving as the purge gas is supplied into the process chamber 201 (the purge gas supply S2).

Specifically, the valve 284 is opened to supply the $N_2$ gas into the process chamber 201. When supplying the $N_2$ gas, the opening degree of the APC valve 247 is maximized to exhaust an inner atmosphere of the process chamber 201.

When the $N_2$ gas is supplied into the process chamber 201, the inside of the process chamber 201 is purged. Thereby, substances such as the HCDS gas and reaction by-products remaining in the process chamber 201 and the recess formed on the surface of the wafer 200 are removed from the process chamber 201. As a result, the inner atmosphere of the process chamber 201 is replaced with the $N_2$ gas.

However, the $N_2$ gas is less likely to reach the bottom of the recess formed on the surface of the wafer 200 than the peripheral side portion of the recess of the wafer 200. In addition, it is difficult to decrease a pressure on the bottom of the recess of the wafer 200. As a result, it is difficult to discharge the substances such as the HCDS gas and the reaction by-products remaining in the recess of the wafer 200, particularly around the bottom of the recess of the wafer 200.

In order to address such a problem, according to the present embodiment, a temperature difference is generated between the front surface and the back surface of the wafer 200 at a timing of supplying the $N_2$ gas to the wafer 200 in the process chamber 201 (that is, the purge gas supply S2). Specifically, the temperature on the front surface of the wafer 200 is set higher than the temperature on the back surface of the wafer 200. As described above, in the space where the temperature difference is present, the gas tends to flow from the low temperature location to the high temperature location. Therefore, by generating the temperature difference as described above between the front surface and the back surface of the wafer 200, it is possible to promote a gas flow from the bottom of the recess of the wafer 200 to the peripheral side portion of the recess of the wafer 200 (see FIG. 4B). As a result, it is possible to promote the movement of the substances such as the HCDS gas and the reaction by-products remaining around the recess of the wafer 200 to the peripheral side portion of the recess of the wafer 200. By generating the temperature difference as described above, while the $N_2$ gas is being supplied, the substances such as the HCDS gas and the reaction by-products that have moved to the peripheral side portion of the recess are pulled out onto the surface of the wafer 200 and discharged by the $N_2$ gas flowing on the surface of the wafer 200. For example, by turning off the heater 213 provided with respect to the back surface of the wafer 200 and turning on the plurality of the lamps 411 provided with respect to the front surface of the wafer 200, and by increasing the output of the plurality of the lamps 411 than the output of the heater 213, the temperature on the front surface of the wafer 200 can be set higher than the temperature on the back surface of the wafer 200 at least for a predetermined time.

Figure 6:
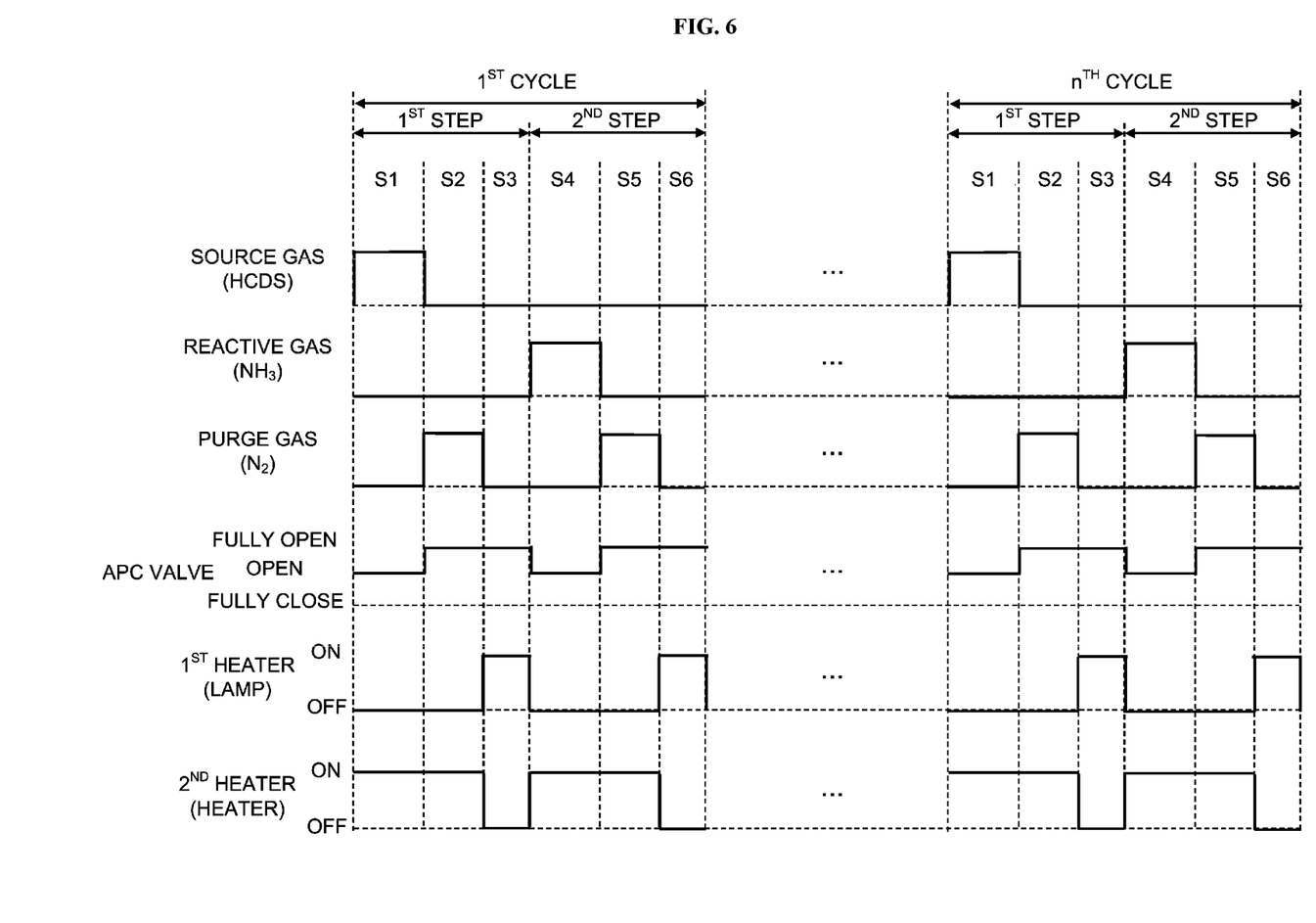
FIG. 6 schematically illustrates an exemplary film-forming sequence preferably used in another embodiment described herein.

Alternatively, as shown in FIG. 6, the temperature on the back surface of the wafer 200 can be set higher than the temperature on the front surface of the wafer 200. Therefore, by generating the temperature difference as described above between the front surface and the back surface of the wafer 200, it is possible to promote the gas flow from the peripheral side portion of the recess of the wafer 200 to the bottom of the recess of the wafer 200 (see FIG. 4A). As a result, the $N_2$ gas flows into the recess of the wafer 200. Thereby, it is possible to desorb the substances such as molecules of the HCDS gas adsorbed on a surface of the recess of the wafer 200 and molecules of the reaction by-products from the surface of the recess of the wafer 200 by supplying the $N_2$ gas. Since the desorbed substances such as the molecules of the HCDS gas and the molecules of the reaction by-products are not adsorbed on the surface inside the recess, it is possible to easily exhaust the desorbed substances in the subsequent vacuum exhaust S3. For example, by turning on the heater 213 provided with respect to the back surface of the wafer 200 and turning off the plurality of the lamps 411 provided with respect to the front surface of the wafer 200, and by decreasing the output of the plurality of the lamps 411 than the output of the heater 213, the temperature on the back surface of the wafer 200 can be set higher than the temperature on the front surface of the wafer 200 at least for a predetermined time.

After the purge gas supply S2 is completed, the valve 284 is closed to stop the supply of the $N_2$ gas.

Subsequently, the inner atmosphere of the process chamber 201 is vacuum-exhausted (decompression-exhausted) while maintaining the opening degree of the APC valve 247 maximized (the vacuum exhaust S3).

By vacuum-exhausting the inner atmosphere of the process chamber 201, it is possible to remove substances such as the HCDS gas, the reaction by-products and the $N_2$ gas, which are remaining in the process chamber 201 or in the recess formed on the surface of the wafer 200, from the process chamber 201.

However, the substances such as the HCDS gas, the reaction by-products and the $N_2$ gas remaining on the bottom of the recess formed on the surface of the wafer 200 is less likely to be discharged than the substances such as the HCDS gas, the reaction by-products and the $N_2$ gas remaining on the peripheral side portion of the recess. Further, it is difficult to adjust the pressure on the bottom of the recess to a vacuum-state (depressurized state) as compared with a pressure on the peripheral side portion of the recess.

In order to address such a problem, according to the present embodiment, a temperature difference is generated between the front surface and the back surface of the wafer 200 at a timing of vacuum-exhausting the inner atmosphere of the process chamber 201 (that is, the vacuum exhaust S3). Specifically, the temperature on the front surface of the wafer 200 is set higher than the temperature on the back surface of the wafer 200. As described above, in the space where the temperature difference is present, the gas tends to flow from the low temperature location to the high temperature location. Therefore, by generating the temperature difference as described above between the front surface and the back surface of the wafer 200, it is possible to promote the movement of the substances such as the HCDS gas, the reaction by-products and the $N_2$ gas remaining on the bottom of the recess of the wafer 200 to the peripheral side portion of the recess of the wafer 200 (see FIG. 4B). As a result, it is possible to promote the discharge of the substances such as the HCDS gas, the reaction by-products and the $N_2$ gas remaining around the bottom of the recess of the wafer 200. For example, by turning on the plurality of the lamps 411 provided with respect to the front surface of the wafer 200 and turning off the heater 213 provided with respect to the back surface of the wafer 200, and by decreasing the output of the heater 213 than the output of the plurality of the lamps 411, the temperature on the front surface of the wafer 200 can be set higher than the temperature on the back surface of the wafer 200 at least for a predetermined time. A temperature control operation (that is, a control operation of the plurality of the lamps 411 and a control operation of the heater 213) in the vacuum exhaust S3 according to the present embodiment may be continuously performed from the purge gas supply S2 when the $N_2$ gas is supplied described above, or may be performed after the temperature difference is reset (that is, the temperature difference is set the same as that of the source gas supply S1 when the source gas is supplied). When the temperature control is continuously performed, the temperature difference may be alleviated. By resetting the temperature difference, it is possible to provide the temperature difference in the vacuum exhaust S3, and it is possible to promote the movement of the gas from the bottom of the recess of the wafer 200 to the peripheral side portion of the recess of the wafer 200.

When an inner pressure of the process chamber 201 reaches and is maintained at a predetermined pressure, the subsequent second step is preformed.

Second Step

In the second step, the reactive gas supply (step S4), a purge gas supply (step S5) and a vacuum exhaust (step S6) are sequentially performed. Hereinafter, the steps S4 through S6 are described in order.

First, the $NH_3$ gas is supplied to the wafer 200 in the process chamber 201 (the reactive gas supply S4).

Specifically, the valve 274 is opened to supply the $NH_3$ gas to the wafer 200 in the process chamber 201. When supplying the $NH_3$ gas, the MFC 273 is adjusted so that a flow rate of the $NH_3$ gas is adjusted to a predetermined flow rate. Further, by adjusting the opening degree of the APC valve 247, the inner pressure of the process vessel 202 (that is, the inner pressure of the process chamber 201) is controlled to a predetermined pressure.

When the $NH_3$ gas is supplied to the wafer 200, the $NH_3$ gas reacts with the silicon-containing layer on the surface of the wafer 200, and the silicon-containing layer is nitrided. By the nitriding the silicon-containing layer, a silicon nitride film (SiN film) is formed on the surface of the wafer 200.

However, the $NH_3$ gas is less likely to reach the bottom of the recess formed on the surface of the wafer 200 than the peripheral side portion of the recess of the wafer 200. As a result, it is difficult to form the SiN film inside the recess of the wafer 200, particularly around the bottom of the recess of the wafer 200.

In order to address such a problem, according to the present embodiment, a temperature difference is generated between the front surface and the back surface of the wafer 200 at a timing of supplying the $NH_3$ gas to the wafer 200 in the process chamber 201 (that is, the reactive gas supply S4). Specifically, the temperature on the back surface of the wafer 200 is set higher than the temperature on the front surface of the wafer 200. As described above, in the space where the temperature difference is present, the gas tends to flow from the low temperature location to the high temperature location. Therefore, by generating the temperature difference as described above between the front surface and the back surface of the wafer 200, it is possible to promote the supply of the $NH_3$ gas from the peripheral side portion of the recess of the wafer 200 to the bottom of the recess (see FIG. 4A). As a result, it is possible to promote the formation of the SiN film around the bottom of the recess of the wafer 200. For example, by turning on the heater 213 provided with respect to the back surface of the wafer 200 and turning off the plurality of the lamps 411 provided with respect to the front surface of the wafer 200, and by decreasing the output of the plurality of the lamps 411 than the output of the heater 213, the temperature on the back surface of the wafer 200 can be set higher than the temperature on the front surface of the wafer 200 at least for a predetermined time.

After the SiN film is formed, the valve 274 is closed to stop the supply of the $NH_3$ gas.

Subsequently, the inert gas such as the $N_2$ gas serving as the purge gas is supplied into the process chamber 201 (the purge gas supply S5).

Specifically, the valve 284 is opened to supply the $N_2$ gas into the process chamber 201. When supplying the $N_2$ gas, the opening degree of the APC valve 247 is maximized to exhaust the inner atmosphere of the process chamber 201.

When the $N_2$ gas is supplied into the process chamber 201, the inside of the process chamber 201 is purged.

Thereby, substances such as the $NH_3$ gas and reaction by-products remaining in the process chamber 201 and the recess formed on the surface of the wafer 200 are removed from the process chamber 201. As a result, the inner atmosphere of the process chamber 201 is replaced with the $N_2$ gas.

However, the $N_2$ gas is less likely to reach the bottom of the recess formed on the surface of the wafer 200 than the peripheral side portion of the recess of the wafer 200. In addition, it is difficult to decrease the pressure on the bottom of the recess of the wafer 200. As a result, it is difficult to discharge the substances such as the $NH_3$ gas and the reaction by-products remaining in the recess of the wafer 200, particularly around the bottom of the recess of the wafer 200.

In order to address such a problem, according to the present embodiment, a temperature difference is generated between the front surface and the back surface of the wafer 200 at a timing of supplying the $N_2$ gas to the wafer 200 in the process chamber 201 (that is, the purge gas supply S5). Specifically, the temperature on the front surface of the wafer 200 is set higher than the temperature on the back surface of the wafer 200. As described above, in the space where the temperature difference is present, the gas tends to flow from the low temperature location to the high temperature location. Therefore, by generating the temperature difference as described above between the front surface and the back surface of the wafer 200, it is possible to promote the gas flow from the bottom of the recess of the wafer 200 to the peripheral side portion of the recess of the wafer 200 (see FIG. 4B). As a result, it is possible to promote the movement of the substances such as the $NH_3$ gas and the reaction by-products remaining around the recess of the wafer 200 to the peripheral side portion of the recess of the wafer 200. By generating the temperature difference as described above, while the $N_2$ gas is being supplied, the substances such as the $NH_3$ gas and the reaction by-products that have moved to the peripheral side portion of the recess are pulled out onto the surface of the wafer 200 and discharged by the $N_2$ gas flowing on the surface of the wafer 200. For example, by turning off the heater 213 provided with respect to the back surface of the wafer 200 and turning on the plurality of the lamps 411 provided with respect to the front surface of the wafer 200, and by increasing the output of the plurality of the lamps 411 than the output of the heater 213, the temperature on the front surface of the wafer 200 can be set higher than the temperature on the back surface of the wafer 200 at least for a predetermined time.

Alternatively, as shown in FIG. 6, the temperature on the back surface of the wafer 200 can be set higher than the temperature on the front surface of the wafer 200. Therefore, by generating the temperature difference as described above between the front surface and the back surface of the wafer 200, it is possible to promote the gas flow from the peripheral side portion of the recess of the wafer 200 to the bottom of the recess of the wafer 200 (see FIG. 4A). As a result, the $N_2$ gas flows into the recess of the wafer 200. Thereby, it is possible to desorb the substances such as molecules of the $NH_3$ gas adsorbed on the surface of the recess of the wafer 200 and molecules of the reaction by-products from the surface of the recess of the wafer 200 by supplying the $N_2$ gas. Since the desorbed substances such as the molecules of the $NH_3$ gas and the molecules of the reaction by-products are not adsorbed on the surface inside the recess, it is possible to easily exhaust the desorbed substances in the subsequent vacuum exhaust S6. For example, by turning on the heater 213 provided with respect to the back surface of the wafer 200 and turning off the plurality of the lamps 411 provided with respect to the front surface of the wafer 200, and by decreasing the output of the plurality of the lamps 411 than the output of the heater 213, the temperature on the back surface of the wafer 200 can be set higher than the temperature on the front surface of the wafer 200 at least for a predetermined time.

After the purge gas supply S5 is completed, the valve 284 is closed to stop the supply of the $N_2$ gas.

Subsequently, the inner atmosphere of the process chamber 201 is vacuum-exhausted (decompression-exhausted) while maintaining the opening degree of the APC valve 247 maximized (the vacuum exhaust S6).

By vacuum-exhausting the inner atmosphere of the process chamber 201, it is possible to remove substances such as the $NH_3$ gas, the reaction by-products and the $N_2$ gas, which are remaining in the process chamber 201 or in the recess formed on the surface of the wafer 200, from the process chamber 201.

However, the substances such as the $NH_3$ gas, the reaction by-products and the $N_2$ gas remaining on the bottom of the recess formed on the surface of the wafer 200 is less likely to be discharged than the substances such as the $NH_3$ gas, the reaction by-products and the $N_2$ gas remaining on the peripheral side portion of the recess. Further, it is difficult to adjust the pressure on the bottom of the recess to the vacuum-state (depressurized state) as compared with the pressure on the peripheral side portion of the recess.

In order to address such a problem, according to the present embodiment, a temperature difference is generated between the front surface and the back surface of the wafer 200 at a timing of vacuum-exhausting the inner atmosphere of the process chamber 201 (that is, the vacuum exhaust S6). Specifically, the temperature on the front surface of the wafer 200 is set higher than the temperature on the back surface of the wafer 200. As described above, in the space where the temperature difference is present, the gas tends to flow from the low temperature location to the high temperature location. Therefore, by generating the temperature difference as described above between the front surface and the back surface of the wafer 200, it is possible to promote the movement of the substances such as the $NH_3$ gas, the reaction by-products and the $N_2$ gas remaining on the bottom of the recess of the wafer 200 to the peripheral side portion of the recess of the wafer 200 (see FIG. 4B). As a result, it is possible to promote the discharge of the substances such as the $NH_3$ gas, the reaction by-products and the $N_2$ gas remaining around the bottom of the recess of the wafer 200. For example, by turning on the plurality of the lamps 411 provided with respect to the front surface of the wafer 200 and turning off the heater 213 provided with respect to the back surface of the wafer 200, and by decreasing the output of the heater 213 than the output of the plurality of the lamps 411, the temperature on the front surface of the wafer 200 can be set higher than the temperature on the back surface of the wafer 200 at least for a predetermined time.

When the inner pressure of the process chamber 201 reaches and is maintained at a predetermined pressure, the substrate unloading step S106 or the first step is performed depending on whether a cycle described later has been performed a predetermined number of times.

Performing Predetermined Number of Times S7

By performing the cycle wherein the first step and the second step described above are performed non-simultaneously (without overlapping) in order the predetermined number of times (n times, n is a natural number equal to or greater than 1), it is possible to form the SiN film of a predetermined composition and a predetermined thickness on the wafer 200. Thereby, the film-forming step S104 is completed.

Substrate Unloading Step S106

After the film-forming step S104 is completed, the substrate unloading step S106 is performed by the substrate processing apparatus 100. In the substrate unloading step S106, the processed wafer 200 is transferred (unloaded) out of the process vessel 202 in the order reverse to that of the substrate loading and placing step S102. That is, by lowering the substrate mounting table 212, the wafer 200 is placed on the lift pins 207 protruding from the surface of the substrate mounting table 212. Thereafter, the gate valve 205 is opened, and the wafer 200 is transferred (unloaded) out of the process chamber 201 using the wafer transfer device (not shown).

(3) Effects According to First Embodiment

According to the first embodiment described above, it is possible to provide one or more of the following effects.

According to the first embodiment, a predetermined temperature difference is generated between the front surface and the back surface of the wafer 200 at a predetermined timing during performing the film-forming step S104. Therefore, it is possible to improve the filling characteristics of the SiN film in the recess formed on the surface of the wafer 200.

For example, the temperature on the back surface of the wafer 200 is set higher than the temperature on the front surface of the wafer 200 at each of the timing of supplying the source gas (HCDS gas) and the timing of supplying the reactive gas ($NH_3$ gas). By generating the temperature difference as described above between the front surface and the back surface of the wafer 200, it is possible to promote the supply of the HCDS gas and the supply of the $NH_3$ gas from the peripheral side portion of the recess of the wafer 200 to the bottom of the recess of the wafer 200, where the gas tends to be less likely to reach. As a result, it is possible to improve the filling characteristics of the SiN film in the recess formed on the surface of the wafer 200.

For example, the temperature on the front surface of the wafer 200 is set higher than the temperature on the back surface of the wafer 200 at the timing of supplying the purge gas ($N_2$ gas) (that is, the purge gas supply S2 or S5). By generating the temperature difference as described above between the front surface and the back surface of the wafer 200, it is possible to promote the gas flow (that is, a flow of the molecules described above) from the bottom of the recess of the wafer 200 to the peripheral side portion of the recess of the wafer 200. That is, it is possible to move at least one among the HCDS gas, the $NH_3$ gas and the reaction by-products from the bottom of the recess of the wafer 200 to the peripheral side portion of the recess of the wafer 200. As a result, it is possible to easily exhaust at least one among the HCDS gas, the $NH_3$ gas and the reaction by-products in the subsequent vacuum exhaust S3 or S6 performed after the purge gas supply S2 or S5. Thereby, it is possible to improve the filling characteristics of the SiN film in the recess formed on the surface of the wafer 200.

Alternatively, for example, the temperature on the back surface of the wafer 200 is set higher than the temperature on the front surface of the wafer 200 at the timing of supplying the purge gas ($N_2$ gas) (that is, the purge gas supply S2 or S5). By generating the temperature difference as described above between the front surface and the back surface of the wafer 200, it is possible to promote the supply of the $N_2$ gas from the peripheral side portion of the recess of the wafer 200 to the bottom of the recess of the wafer 200, where the gas is less likely to reach. As a result, it is possible to desorb at least one among the molecules of the HCDS gas, the molecules of the $NH_3$ gas and the molecules of the reaction by-products, which are adsorbed on the surface of the recess of the wafer 200 (particularly, the surface around the bottom of the recess), from the surface of the recess of the wafer 200. As a result, it is possible to easily exhaust at least one among the HCDS gas, the $NH_3$ gas and the reaction by-products in the subsequent vacuum exhaust S3 or S6 performed after the purge gas supply S2 or S5. Thereby, it is possible to improve the filling characteristics of the SiN film in the recess formed on the surface of the wafer 200.

For example, the temperature on the front surface of the wafer 200 is set higher than the temperature on the back surface of the wafer 200 at the timing of timing of vacuum-exhausting the inner atmosphere of the process chamber 201 (that is, the vacuum exhaust S3 or S6). By generating the temperature difference as described above between the front surface and the back surface of the wafer 200, it is possible to promote the movement of at least one among the HCDS gas, the $NH_3$ gas, the reaction by-products and the $N_2$ gas remaining around the bottom of the recess to the peripheral side portion of the recess of the wafer 200. As a result, it is possible to promote the discharge of at least one among the HCDS gas, the $NH_3$ gas, the reaction by-products and the $N_2$ gas remaining around the bottom of the recess. Thereby, it is possible to appropriately depressurize the recess of the wafer 200, and it is possible to supply the HCDS gas or the $NH_3$ gas to the bottom of the recess in the subsequent step. As a result, it is possible to improve the filling characteristics of the SiN film in the recess formed on the surface of the wafer 200.

Second Embodiment

Hereinafter, a second embodiment according to the technique of the present disclosure will be described with reference to FIG. 5.

The first embodiment described above is described by way of an example in which the heater 213 is continuously turned on and the plurality of the lamps 411 are continuously turned off or the heater 213 is continuously turned off and the plurality of the lamps 411 are continuously turned on when supplying at least one among the gas, the reactive gas and the purge gas, which may be collectively or individually referred to as the gas, in the first step and the second step. However, depending on a gas supply time, the heat on the back surface of the wafer 200 heated by the heater 213 may be transferred to the front surface of the wafer 200 so that the temperature difference between the front surface and the back surface of the wafer 200 may be reduced. That is, for example, in the first embodiment, the gas may be continuously supplied to the wafer 200 even when the temperature difference between the front surface and the back surface of the wafer 200 is reduced. When the gas is continuously supplied to the wafer 200 when the temperature difference between the front surface and the back surface of the wafer 200 is reduced, it is difficult to exhibit the characteristics described above that the gas tends to flow from the low temperature location to the high temperature location Therefore, it may be difficult to obtain the effects described above.

Further, the first embodiment described above is described by way of an example in which the plurality of the lamps 411 are continuously turned on and the heater 213 is continuously turned off when the inner atmosphere of the process chamber 201 is vacuum-exhausted (that is, the vacuum exhaust S3 or S6) in the first step and the second step. However, depending on a time duration of performing the vacuum exhaust S6, the heat on the front surface of the wafer 200 heated by the plurality of the lamps 411 may be transferred to the back surface of the wafer 200 so that the temperature difference between the front surface and the back surface of the wafer 200 may be reduced. That is, for example, in the first embodiment, the inner atmosphere of the process chamber 201 may be continuously vacuum-exhausted even when the temperature difference between the front surface and the back surface of the wafer 200 is reduced. When the inner atmosphere of the process chamber 201 is continuously vacuum-exhausted when the temperature difference between the front surface and the back surface of the wafer 200 is reduced, it is difficult to exhibit the characteristics described above that the gas tends to flow from the low temperature location to the high temperature location Therefore, it may be difficult to obtain the effects described above.

Therefore, according to the present embodiment, a method of suppressing the reduction of the temperature difference between the front surface and the back surface of the wafer 200 will be described. For example, the description of features such as a first step and a second step according to the present embodiment the same as those of the first step and the second step of the first embodiment may be omitted.

In a film-forming sequence shown in FIG. 5, the first step and the second step according to the present embodiment, which are described later, are performed.

First Step

In the first step according to the present embodiment, when supplying the source gas (HCDS gas) to the wafer 200 (that is, the source gas supply S1 of the present embodiment), by turning on the heater 213 provided with respect to the back surface of the wafer 200 and turning off the plurality of the lamps 411 provided with respect to the front surface of the wafer 200, the temperature on the back surface of the wafer 200 is set higher than the temperature on the front surface of the wafer 200. Thereafter, when the temperature difference between the front surface and the back surface of the wafer 200 disappears as the heat on the back surface of the wafer 200 heated by the heater 213 is transferred to the front surface of the wafer 200, the plurality of the lamps 411 are turned on. After a predetermined time has elapsed, the plurality of the lamps 411 are turned off again to elevate the temperature on the back surface of the wafer 200 higher than the temperature on the front surface of the wafer 200. By repeatedly performing the turn-on operation and the turn-off operation of the plurality of the lamps 411 as described above, it is possible to intermittently apply the temperature difference between the front surface and the back surface of the wafer 200.

According to the present embodiment, the HCDS gas is supplied when the temperature difference exists between the front surface and the back surface of the wafer 200, and the supply of the HCDS gas is stopped when there is no temperature difference between the front surface and the back surface of the wafer 200. Alternatively, the HCDS gas may be continuously supplied regardless of the presence or absence of the temperature difference between the front surface and the back surface of the wafer 200.

The same method as the source gas supply S1 of the present embodiment described above is also used when supplying the purge gas (N$_2$ gas) (that is, the purge gas supply S2 of the present embodiment) after the source gas supply S1 of the present embodiment. That is, when supplying the N$_2$ gas, by repeatedly performing the turn-on operation and the turn-off operation of the plurality of the lamps 411 as described above, it is possible to intermittently apply the temperature difference between the front surface and the back surface of the wafer 200. Further, the N$_2$ gas is supplied when the temperature difference exists between the front surface and the back surface of the wafer 200, and the supply of the N$_2$ gas is stopped when there is no temperature difference between the front surface and the back surface of the wafer 200. Alternatively, the N$_2$ gas may be continuously supplied regardless of the presence or absence of the temperature difference between the front surface and the back surface of the wafer 200. By performing the purge gas supply S2 of the present embodiment as described above, it is possible to further promote the desorption of the substances such as the HCDS gas remaining around the bottom of the recess of the wafer 200 from the surface of the recess of the wafer 200. The unreacted HCDS gas and the reaction by-products desorbed from the surface of the recess are discharged from the recess of the wafer 200 while the supply of the N$_2$ gas is stopped. By repeatedly performing the supply of the N$_2$ gas and the exhaust (stop the supply of the N$_2$ gas), it is possible to improve the discharge efficiency in the recess. When repeatedly performing the supply of the N$_2$ gas and the exhaust, the plurality of the lamps 411 may be turned off.

Subsequently, when vacuum-exhausting the inner atmosphere of the process chamber 201 (that is, the vacuum exhaust S3 of the present embodiment), by turning on the plurality of the lamps 411 and turning off the heater 213, the temperature on the front surface of the wafer 200 is set higher than the temperature on the back surface of the wafer 200. Thereafter, the plurality of the lamps 411 are turned off before the temperature difference between the front surface and the back surface of the wafer 200 is set lower than a predetermined threshold value as the heat on the front surface of the wafer 200 heated by the plurality of the lamps 411 is transferred to the back surface of the wafer 200. When the temperature of the front surface and the back surface of the wafer 200 is lowered to some extent, the plurality of the lamps 411 are turned on again to elevate the temperature on the front surface of the wafer 200 higher than the temperature on the back surface of the wafer 200. By repeatedly performing the turn-on operation and the turn-off operation of the plurality of the lamps 411 as described above, it is possible to intermittently apply the temperature difference between the front surface and the back surface of the wafer 200.

Second Step

In the second step according to the present embodiment, when supplying the reactive gas (NH$_3$ gas) to the wafer 200 (that is, the reactive gas supply S4 of the present embodiment), by turning on the heater 213 provided with respect to the back surface of the wafer 200 and turning off the plurality of the lamps 411 provided with respect to the front surface of the wafer 200, the temperature on the back surface of the wafer 200 is set higher than the temperature on the front surface of the wafer 200. Thereafter, the plurality of the lamps 411 are turned on when the temperature difference between the front surface and the back surface of the wafer 200 disappears as the heat on the back surface of the wafer 200 heated by the heater 213 is transferred to the front surface of the wafer 200. After a predetermined time has elapsed, the plurality of the lamps 411 are turned off again to elevate the temperature on the back surface of the wafer 200 higher than the temperature on the front surface of the wafer 200. By repeatedly performing the turn-on operation and the turn-off operation of the plurality of the lamps 411 as described above, it is possible to intermittently apply the temperature difference between the front surface and the back surface of the wafer 200.

According to the present embodiment, the $NH_3$ gas is supplied when the temperature difference exists between the front surface and the back surface of the wafer 200, and the supply of the $NH_3$ gas is stopped when there is no temperature difference between the front surface and the back surface of the wafer 200. Alternatively, the $NH_3$ gas may be continuously supplied regardless of the presence or absence of the temperature difference between the front surface and the back surface of the wafer 200.

The same method as the reactive gas supply S4 of the present embodiment described above is also used when supplying the purge gas ($N_2$ gas) (that is, the purge gas supply S5 of the present embodiment) after the reactive gas supply S4 of the present embodiment. That is, when supplying the $N_2$ gas, by repeatedly performing the turn-on operation and the turn-off operation of the plurality of the lamps 411 as described above, it is possible to intermittently apply the temperature difference between the front surface and the back surface of the wafer 200. Further, the $N_2$ gas is supplied when the temperature difference exists between the front surface and the back surface of the wafer 200 is present, and the supply of the $N_2$ gas is stopped when there is no temperature difference between the front surface and the back surface of the wafer 200. Alternatively, the $N_2$ gas may be continuously supplied regardless of the presence or absence of the temperature difference between the front surface and the back surface of the wafer 200.

Subsequently, when vacuum-exhausting the inner atmosphere of the process chamber 201 (that is, the vacuum exhaust S6 of the present embodiment), by turning on the plurality of the lamps 411 and turning off the heater 213, the temperature on the front surface of the wafer 200 is set higher than the temperature on the back surface of the wafer 200. Thereafter, the plurality of the lamps 411 are turned off before the temperature difference between the front surface and the back surface of the wafer 200 is set lower than a predetermined threshold value as the heat on the front surface of the wafer 200 heated by the plurality of the lamps 411 is transferred to the back surface of the wafer 200. When the temperature of the front surface and the back surface of the wafer 200 is lowered to some extent, the plurality of the lamps 411 are turned on again to elevate the temperature on the front surface of the wafer 200 higher than the temperature on the back surface of the wafer 200. By repeatedly performing the turn-on operation and the turn-off operation of the plurality of the lamps 411 as described above, it is possible to intermittently apply the temperature difference between the front surface and the back surface of the wafer 200.

For example, the present embodiment is described by way of an example in which the turn-on operation and the turn-off operation of the plurality of the lamps 411 are repeatedly performed as a method of intermittently applying the temperature difference between the front surface and the back surface of the wafer 200. However, the present embodiment is not limited thereto. For example, the turn-on operation and the turn-off operation of the heater 213 may be repeatedly performed to intermittently apply the temperature difference between the front surface and the back surface of the wafer 200. Further, the output of the heater 213 and the output of the plurality of the lamps 411 may be adjusted to intermittently apply the temperature difference between the front surface and the back surface of the wafer 200.

For example, the present embodiment is described by way of an example in which the turn-on operation and the turn-off operation of the plurality of the lamps 411 are repeatedly performed in the first step and the second step. However, the present embodiment is not limited thereto. For example, at least one among the source gas supply S1, the vacuum exhaust S3, the reactive gas supply S4 and the vacuum exhaust S6 in the film-forming sequence of FIG. 5, the fixed operation of the plurality of the lamps 411 shown in FIG. 3B may be performed without repeatedly performing the turn-on operation and the turn-off operation of the plurality of the lamps 411 (that is, the plurality of the lamps 411 is continuously turned on or the plurality of the lamps 411 is continuously turned off). In other words, in the film-forming sequence of FIG. 5, the turn-on operation and the turn-off operation of the plurality of the lamps 411 may be performed at least when the purge gas is supplied (that is, the purge gas supply S2 and the purge gas supply S5). It is preferable that the turn-on operation and the turn-off operation of the plurality of the lamps 411 is repeatedly performed when the purge gas is supplied (that is, the purge gas supply S2 and the purge gas supply S5) and when the inner atmosphere of the process chamber 201 is vacuum-exhausted (that is, the vacuum exhaust S3 and the vacuum exhaust S6). That is, the discharge effect due to the temperature difference described above is remarkable in the steps such as the purge gas supply S2, the purge gas supply S5, the vacuum exhaust S3 and the vacuum exhaust S6. Further, the turn-on operation and the turn-off operation of the plurality of the lamps 411 may be repeatedly performed at least one among when the source gas is supplied (that is, the source gas supply S1) and the reactive gas is supplied (that is, the reactive gas supply S4). By performing such an operation when the source gas is supplied and the reactive gas is supplied, as described above, it is possible to improve the discharge efficiency of discharging the unreacted gas and the reaction by-products. It is also possible to promote the adsorption of the source gas (reactive gas).

Figure 5:
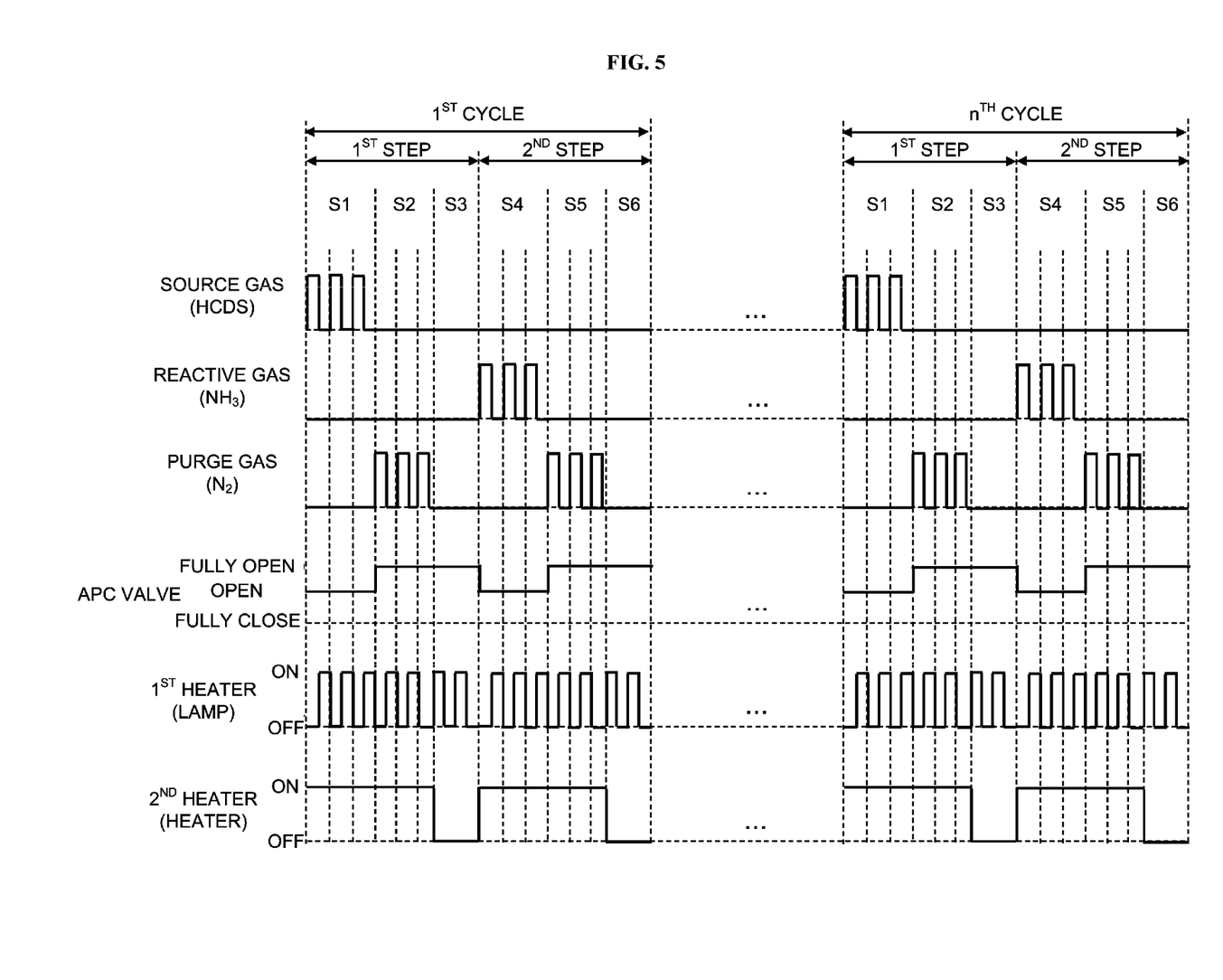
FIG. 5 schematically illustrates an exemplary film-forming sequence preferably used in a second embodiment described herein.

For example, as shown in FIG. 5, the present embodiment is described by way of an example in which the supply of the gas and the stop of the supply of the gas are repeatedly performed in the source gas supply S1, the purge gas supply S2, the reactive gas supply S4 and the purge gas supply S5. However, the present embodiment is not limited thereto. For example, the film-forming sequence shown in FIG. 5 may be modified such that the supply of the gas and the stop of the supply of the gas are repeatedly performed when at least one or more gases are supplied. For example, the source gas and the reactive gas may be continuously supplied for a certain period of time as shown in FIG. 3B, and the supply of the purge gas and the stop of the supply of the purge gas are repeatedly performed when the purge gas is supplied in the purge gas supply S2 or the purge gas supply S5.

Other Embodiments

While the technique is described in detail by way of the first embodiment and the second embodiment, the above-described technique is not limited thereto. The above-described technique may be modified in various ways without departing from the gist thereof.

For example, the first embodiment and the second embodiment are described by way of an example in which the source gas supply S1, the purge gas supply S2 and the vacuum exhaust S3 are sequentially performed in order in the first step. However, the above-described technique is not limited thereto. For example, the above-described technique may also be applied when the source gas supply S1 and the vacuum exhaust S3 are sequentially performed in order in the first step without performing the purge gas supply S2. For example, the first embodiment and the second embodiment are described by way of an example in which the reactive gas supply S4, the purge gas supply S5 and the vacuum exhaust S6 are sequentially performed in order in the second step. However, the above-described technique is not limited thereto. For example, the above-described technique may also be applied when the reactive gas supply S4 and the vacuum exhaust S6 are sequentially performed in order in the second step without performing the purge gas supply S5.

Figure 4B:
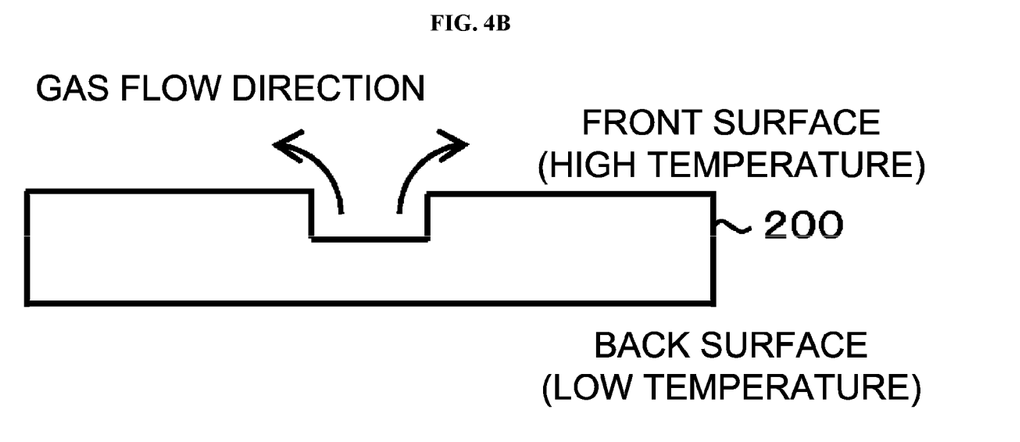
FIG. 4B schematically illustrates a gas flow when the temperature on the front surface of the substrate is higher than the temperature on the back surface of the substrate.

For example, the first embodiment and the second embodiment are described by way of an example in which the temperature difference shown in FIG. 4B is applied in the vacuum exhaust S3 and the vacuum exhaust S6. However, the above-described technique is not limited thereto. For example, during the vacuum exhaust S3 or S6, or after the vacuum exhaust S3 or S6 and before the subsequent source gas supply S1 (or the reactive gas supply S4), by turning off the plurality of the lamps 411 and turning on the heater 213, a step (temperature returning step) of returning the temperature difference to that shown in FIG. 4A may be performed. Thereby, it is possible to easily supply the source gas (or the reactive gas) to the bottom of the recess (groove) at an initial stage of the supply of the source gas (or the reactive gas). As a result, it is possible to improve the filling characteristics in the recess such as the groove and a hole formed on the substrate.

For example, the first embodiment and the second embodiment are described by way of an example in which the filling characteristics in the recess such as the groove and the hole are improved. However, the above-described technique is not limited thereto. For example, it is also possible to improve a step coverage characteristic of uniformly forming the film on the surface in the recess such as the groove and the hole.

As described above, according to some embodiments in the present disclosure, it is possible to form the film so as to fill the inside of the recess provided on the surface of the substrate.

What is claimed is:

1. A method of processing a substrate, comprising:
   (a) forming a film by performing a cycle a predetermined number of times, the cycle comprising:
      (a-1) supplying a gas to a substrate in a process chamber; and
      (a-2) vacuum-exhausting an inner atmosphere of the process chamber; and
   (b) generating a predetermined temperature difference between a front surface of the substrate and a back surface of the substrate at a predetermined timing during (a),
   wherein a temperature on the front surface of the substrate is set at least temporarily higher than a temperature on the back surface of the substrate at a timing of vacuum-exhausting the inner atmosphere of the process chamber.

2. The method of claim 1, wherein the temperature on the back surface of the substrate is set at least temporarily higher than the temperature on the front surface of the substrate at a timing of supplying the gas into the process chamber.

3. The method of claim 2, wherein the gas comprises a source gas, and the temperature on the back surface of the substrate is set at least temporarily higher than the temperature on the front surface of the substrate at a timing of supplying the source gas into the process chamber.

4. The method of claim 2, wherein the gas comprises an inert gas, and the temperature on the back surface of the substrate is set at least temporarily higher than the temperature on the front surface of the substrate at a timing of supplying the inert gas into the process chamber.

5. The method of claim 1, wherein the gas comprises a source gas, and the temperature on the back surface of the substrate is set at least temporarily higher than the temperature on the front surface of the substrate at a timing of supplying the source gas into the process chamber.

6. The method of claim 5, wherein the gas comprises an inert gas, and the temperature on the back surface of the substrate is set at least temporarily higher than the temperature on the front surface of the substrate at a timing of supplying the inert gas into the process chamber.

7. The method of claim 1, wherein the gas comprises an inert gas, and the temperature on the back surface of the substrate is set at least temporarily higher than the temperature on the front surface of the substrate at a timing of supplying the inert gas into the process chamber.

8. The method of claim 1, wherein the gas comprises an inert gas, and the temperature on the front surface of the substrate is set at least temporarily higher than the temperature on the back surface of the substrate at a timing of supplying the inert gas into the process chamber.

9. The method of claim 1, wherein the temperature on the front surface of the substrate is set higher than the temperature on the back surface of the substrate at a timing of supplying the gas into the process chamber.

10. The method of claim 1, wherein a supply of the gas and a stop of the supply of the gas are repeatedly performed at a timing of supplying the gas into the process chamber.

11. The method of claim 10, wherein a temperature difference between the front surface of the substrate and the back surface of the substrate is generated in accordance with the supply of the gas and the stop of the supply of the gas.

12. The method of claim 10, wherein the gas comprises an inert gas, a temperature difference between the front surface of the substrate and the back surface of the substrate is generated at least temporarily at the timing of vacuum-exhausting the inner atmosphere of the process chamber after a temperature difference between the front surface of the substrate and the back surface of the substrate is generated at least temporarily at a timing of supplying the inert gas into the process chamber.

13. The method of claim 10, wherein the gas comprises at least one among a source gas, a reactive gas and an inert gas.

14. The method of claim 1, wherein the substrate comprises a substrate with a recess formed on a surface thereof.

15. A substrate processing apparatus comprising:
   a process chamber in which a substrate is accommodated;
   a gas supplier configured to supply a gas into the process chamber;
   a vacuum exhauster configured to exhaust an inner atmosphere of the process chamber;
   a first heater configured to heat a front surface of the substrate in the process chamber;
   a second heater configured to heat a back surface of the substrate in the process chamber; and
   a controller configured to be capable of controlling the gas supplier and the vacuum exhauster to perform: (a) forming a film by performing a cycle a predetermined number of times, the cycle comprising (a-1) supplying the gas to the substrate in the process chamber and (a-2)

vacuum-exhausting the inner atmosphere of the process chamber; and to be capable of controlling the first heater and the second heater to perform: (b) generating a predetermined temperature difference between the front surface of the substrate and the back surface of the substrate at a predetermined timing during (a), wherein a temperature on the front surface of the substrate is set at least temporarily higher than a temperature on the back surface of the substrate at a timing of vacuum-exhausting the inner atmosphere of the process chamber.

16. A non-transitory computer-readable recording medium storing a program that causes, by a computer, a substrate processing apparatus to perform:
 (a) forming a film by performing a cycle a predetermined number of times, the cycle comprising:
  (a-1) supplying a gas to a substrate in a process chamber of the substrate processing apparatus; and
  (a-2) vacuum-exhausting an inner atmosphere of the process chamber; and
 (b) generating a predetermined temperature difference between a front surface of the substrate and a back surface of the substrate at a predetermined timing during (a),
wherein a temperature on the front surface of the substrate is set at least temporarily higher than a temperature on the back surface of the substrate at a timing of vacuum-exhausting the inner atmosphere of the process chamber.

17. A method of manufacturing a semiconductor device, comprising processing the substrate according to the method of claim 1.

* * * * *